United States Patent
Huang et al.

(10) Patent No.: US 9,892,907 B2
(45) Date of Patent: Feb. 13, 2018

(54) ATMOSPHERIC-PRESSURE PLASMA PROCESSING APPARATUS FOR SUBSTRATES

(71) Applicants: BOE TECHNOLOGY GROUP CO., LTD., Beijing (CN); HEFEI BOE OPTOELECTRONICS TECHNOLOGY CO., LTD., Hefei (CN)

(72) Inventors: Wentong Huang, Beijing (CN); Wenbin Hu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 205 days.

(21) Appl. No.: 14/059,019

(22) Filed: Oct. 21, 2013

(65) Prior Publication Data

US 2014/0110059 A1 Apr. 24, 2014

(30) Foreign Application Priority Data

Oct. 19, 2012 (CN) .......................... 2012 1 0401682

(51) Int. Cl.
| | | |
|---|---|---|
| H01L 21/00 | (2006.01) | |
| C23C 16/00 | (2006.01) | |
| H01L 21/02 | (2006.01) | |
| H01J 37/32 | (2006.01) | |

(52) U.S. Cl.
CPC .. *H01L 21/02002* (2013.01); *H01J 37/32091* (2013.01); *H01J 37/32541* (2013.01);
(Continued)

(58) Field of Classification Search
CPC ...................... H01J 37/32825; H01J 37/32752
(Continued)

(56) References Cited

U.S. PATENT DOCUMENTS 5,938,854 A * 8/1999 Roth ..................... B08B 7/0035
134/1
6,758,941 B1 * 7/2004 Ookawa ............ H01J 37/32082
118/723 E
(Continued)

FOREIGN PATENT DOCUMENTS

| CN | 1783431 A | 6/2006 |
|---|---|---|
| CN | 101632327 A | 1/2010 |
| JP | 2003019433 A * | 1/2003 |
| JP | 2008287895 A * | 11/2008 |

OTHER PUBLICATIONS

First Chinese Office Action Appln. No. 201210401682.8; dated Dec. 3, 2014.

*Primary Examiner* — Parviz Hassanzadeh
*Assistant Examiner* — Anna Crowell
(74) *Attorney, Agent, or Firm* — Ladas & Parry LLP

(57) ABSTRACT

An Atmospheric-Pressure Plasma processing apparatus used for Atmospheric-Pressure Plasma processing of substrates, comprises a radio-frequency generator and two electrode plates disposed vertically and opposing each other. The two electrode plates have two surface opposing to each other, one of which is a flat surface, and the other is a stepped surface, such that a gap is provided between the two electrode plates and said gap comprising a narrower gap part at an upper side and a wider gap part at a lower side. The radio-frequency generator is connected to the two electrode plates, and applies radio-frequency signals to the two electrode plates so as to generate plasma within the gap.

17 Claims, 2 Drawing Sheets

(52) U.S. Cl.
CPC .. *H01J 37/32568* (2013.01); *H01J 37/32752* (2013.01); *H01J 37/32825* (2013.01)

(58) Field of Classification Search
USPC ....... 118/723 E; 156/345.43, 345.44, 345.45, 156/345.46, 345.47
See application file for complete search history.

(56) References Cited

U.S. PATENT DOCUMENTS

| | | | | |
|---|---|---|---|---|
| 7,615,131 | B2* | 11/2009 | Lim | H01J 37/32091 |
| | | | | 118/723 E |
| 8,697,197 | B2* | 4/2014 | Savas | C23C 16/24 |
| | | | | 427/569 |
| 2003/0104141 | A1* | 6/2003 | Amato-Wierda | C23C 16/4407 |
| | | | | 427/580 |
| 2005/0001527 | A1* | 1/2005 | Sugiyama | C23C 16/505 |
| | | | | 313/231.31 |
| 2006/0054279 | A1* | 3/2006 | Kim | H05H 1/24 |
| | | | | 156/345.33 |
| 2006/0196424 | A1* | 9/2006 | Swallow | H05H 1/24 |
| | | | | 118/723 E |
| 2007/0146621 | A1* | 6/2007 | Yeom | G02F 1/1309 |
| | | | | 349/187 |
| 2010/0064971 | A1* | 3/2010 | Lee | C23C 16/45578 |
| | | | | 118/723 E |
| 2010/0147464 | A1 | 6/2010 | Shibata et al. | |
| 2010/0296979 | A1 | 11/2010 | Hori et al. | |
| 2012/0225218 | A1* | 9/2012 | Savas | C23C 16/45574 |
| | | | | 427/576 |

* cited by examiner

ATMOSPHERIC-PRESSURE PLASMA PROCESSING APPARATUS FOR SUBSTRATES

FIELD OF THE INVENTION

The Present invention relates to an Atmospheric-Pressure Plasma processing apparatus, in particular an Atmospheric-Pressure Plasma processing apparatus for substrates.

BACKGROUND

With the increasing development of display techniques, LCD has played a predominant role in the panel display field. In the course of manufacturing a liquid crystal display, it's required to improve the adhesivity between the photoresist and the non-metallic films. Therefore, the glass substrate (which may also be display substrates of other materials) is subjected to surface treatment by an Atmospheric-Pressure Plasma (APP) processing apparatus before coating photoresist onto the glass substrate.

Most of the existing APP processing apparatuses take the way of Dielectric Barrier Discharge (BDB). Specifically, one or more layer of insulation dielectrics is/are arranged between the upper and lower two electrode plates, and when the AC voltage applied to the two electrode plates is high enough, the gas between the two electrode plates would be broken down and thus Dielectric Barrier Discharge (DBD) is caused. The presentation of insulation dielectric avoids the formation of DC breakdown discharge between the two plates electrodes, such as arc light or spark discharge, such that gaseous discharge distributed more evenly in the space between the two electrode plates is caused and thus plasma is provided. But yet, such a discharge manner is composed of extensive quick impulsive discharge channels, and it's difficult for the even distribution to be provided between the two electrode plates.

In existing production line, the lower electrode plate of the APP processing apparatus is provided with a number of through holes thereon, such that plasma can pass through these through holes and process the glass substrate below the lower electrode plate. However, such configuration can not ensure an even distribution for the plasma onto the glass substrate, and the density of plasma on the glass substrate corresponding to the position of the through holes is higher, whereas the density of plasma corresponding to the position of spacing between the through holes; and further, the dose of plasma leak out from each through hole is not equivalent. Therefore, it's difficult for the existing APP processing apparatus to create even distribution of the plasma on the glass substrate, thus causing partial peel-off of the photoresist on the glass substrate and influencing the yielding rate of product.

SUMMARY

The embodiment of present invention provides an Atmospheric-Pressure Plasma processing apparatus for display substrate, to overcome the technical matters in existing APP processing apparatus that it's difficult to evenly distribute plasma on the glass substrate.

According to embodiments of the present invention, an Atmospheric-Pressure Plasma processing apparatus is provided, which is for Atmospheric-Pressure Plasma processing of substrates, and comprises a radio-frequency generator and two electrode plates disposed vertically and opposing each other, wherein the two electrode plates have two surface opposing to each other, one of which is a flat surface, and the other is a stepped surface, such that a gap is provided between the two electrode plates and said gap comprising a narrower gap part at an upper side and a wider gap part at a lower side; and the radio-frequency generator is connected to the two electrode plates, and applies radio-frequency signals to the two electrode plates so as to generate plasma within the gap.

Preferably, the Atmospheric-Pressure Plasma processing apparatus further comprises a conveyor mechanism located below the two electrode plates and conveying the substrate in a conveying direction perpendicular to the opposing surfaces of the two electrode plates.

Preferably, a matcher is connected in series between the radio-frequency generator and one of the two electrode plates for impedance matching between the radio-frequency generator and the two electrode plates.

Preferably, a width of the wider gap portion of the gap in a direction perpendicular to the opposing surfaces of the two electrode plates is 2-4 mm. More preferably, the width of the wider gap portion of the gap is 3 mm.

Preferably, a height of the wider gap portion of the gap in a vertical direction is 8-12 cm, and more preferably 10 cm.

Preferably, a width of the narrower gap portion of the gap in the direction perpendicular to the opposing surfaces of the two electrode plates is less than 1 mm.

Preferably, outer surfaces of the two electrode plates and openings at the upper end and at both sides of the gap are covered with insulating material, the insulating material forming a shell-shaped insulating layer opening downward so as to encase the two electrode plates and the gap.

Preferably, the insulating material covered on the openings at the sides of the gap is formed with a window for exposing part of the wider gap portion of the gap.

Preferably, a gas distributor is provided at a top of the gap, for supplying reactant gas into the gap and distributing evenly the reactant gas within the gap.

A distance sensor can be provided at a bottom of one of the electrode plates for detecting a distance between the two electrode plates and the substrate. The distance sensor is preferably a contact sensor.

The Atmospheric-Pressure Plasma processing apparatus can further comprise a static-electricity detector for detecting surface static-electricity of the substrate processed by the Atmospheric-Pressure Plasma processing apparatus.

The Atmospheric-Pressure Plasma processing apparatus can further comprise a temperature detector for detecting surface temperature of the substrate processed by the Atmospheric-Pressure Plasma processing apparatus.

BRIEF DESCRIPTION OF THE DRAWINGS

In order to illustrate the technical solution of the embodiment of present invention more clearly, a simply introduction about the drawings of the embodiments will be made in the following, and obviously, the drawings described later relate to only some embodiments of the present invention, rather than limitation to the present invention.

DETAILED DESCRIPTION

A clearly and full description about the technical solution in the embodiments of the present invention will be made in the following in conjunction with drawings, obviously, the described embodiments are only part of the described embodiments, but not the whole of the embodiments. Based on the described embodiments of present invention, all the other embodiments achieved by the ordinary skilled in this art without any creative work belong to the protective scope of the present invention.

It is to note that the expressions of directions in the present application, such as vertical, horizontal, upper, lower, left, right etc., are used for representing relative positional relationship, and not for limiting absolute orientation. Of course, the apparatus and parts thereof of the present invention can also take other orientations, as long as the relative positional relationship defined by the above expressions upon directions is satisfied.

Embodiment 1

Figure 1:
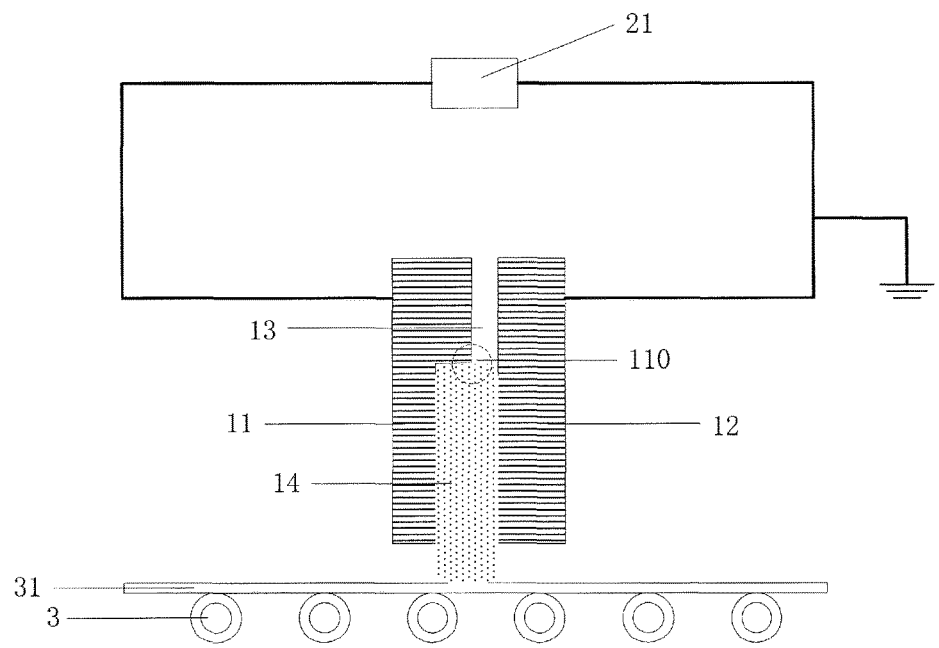
FIG. 1 is a structural schematic view of an APP processing apparatus according to embodiment 1 of present invention.

As shown in FIG. 1, the Atmospheric-Pressure Plasma (APP) processing apparatus according to the embodiment of present invention is used for APP processing of substrate, for example a display substrate. As an example, the Atmospheric-Pressure Plasma processing apparatus according to the present embodiment is used for APP processing of a glass substrate 31. The APP processing apparatus comprises a radio-frequency generator 21 and two electrode plates 11, 12 disposed vertically and opposing each other. The inner surface of rear electrode plate 12 is a flat surface, and the inner surface of front electrode plate 11 is a stepped surface, such that a gap 13 is provided between the two electrode plates 11, 12, which gap 13 comprises a narrower gap part at the upper side and a wider gap part at the lower side. The glass substrate is taken as the substrate to be processed, and of course the substrate to be processed can also be substrates of other materials, for example a substrate of composite material etc.

In the APP processing apparatus according to the embodiment of present invention, due to the fact that the inner surface of one of the two electrode plates (i.e. one of the opposing surfaces of the two electrode plates) is a stepped surface, when radio frequency (electric field) signals are applied between the two electrode plates by the radio-frequency generator, the lobing at the corner on the stepped surface will, due to its intensive electric field and its opposing electrode plate having a flat surface, cause corona or glow-discharge, thereby achieving the effect of glow-discharge and subsequently yielding a large area of steady glow-discharge between the two electrode plates with the increasing of the power of the radio-frequency generator. Because of the narrower gap and the wider gap portions of the gap between the two electrode plates, the flowing of gas within the gap can cause a certain differential gas pressure between these two portions, in such a way that discharging only occurs at the wider gap portion having a higher atmospheric pressure between the two electrode plates, that is, radio frequency capacitive coupling plasma is generated within the wider gap portion. And when the substrate passes below the two electrode plates, the radio frequency capacitive coupling plasma within this gap will perform surface treatment to the substrate.

The radio frequency capacitive coupling plasma is a kind of glow-discharged plasma being uniform and steady, and this plasma can be coated directly onto the surface of the substrate from within the gap such that the plasma can have a sufficient uniform contact with the surface of the substrate. Therefore, the APP processing apparatus according to this embodiment can cause an even distribution of the plasma on the substrate, thereby effectively avoiding the slough of photoresist after being coated on the substrate and thus improving the yield rate of product.

The radio-frequency generator 21 can have an operation frequency of for example 13.56 MHz, and both ends thereof are connected with the two electrode plates 11, 12 respectively and apply radio-frequency signals to the two electrode plates 11, 12. For example, the positive pole of the Radio-frequency generator 21 is connected to the front electrode plate 11, the negative pole is connected to the rear electrode plate 12, and the rear electrode plate 12 is grounded. When the radio-frequency generator 21 applies radio frequency (electric field) signals between the two electrode plates 11, 12, the lobing 110 at the corner on the stepped surface of the front electrode plate 11 will, due to its intensive electric field and its opposing rear electrode plate 12 having a flat inner surface, cause corona or glow-discharge, thereby achieving the effect of glow-discharge and subsequently yielding a large area of steady glow-discharge between the two electrode plates 11, 12 with the increasing of the power of the radio-frequency generator 21. Because of the narrower gap and the wider gap portions for the gap 13 between the two electrode plates 11, 12, the flow of gas within the gap 13 could cause a certain differential gas pressure between these two portions, in such a way that discharging only occurs at the wider gap portion having a higher atmospheric pressure between the two electrode plates 11, 12, that is, radio frequency capacitive coupling plasma 14 is generated within the wider gap portion.

As a preferred solution, the APP processing apparatus further comprises a conveyor mechanism 3, which is located below the two electrode plates 11, 12 with a conveying direction perpendicular to the opposing surfaces of the two electrode plates 11, 12 (in the rightward direction in FIG. 1). The conveyor mechanism 3 can be for example a conveying roller or conveying belt for transferring the glass substrate 31 below the two electrode plates 11, 12. When the glass substrate 31 passes below the two electrode plates 11, 12 under the driving of the conveyor mechanism 3, the radio frequency capacitive coupling plasma 14 within the gap 13 can perform surface treatment to the glass substrate 31.

In the APP processing apparatus according to the embodiment of present invention, the Radio frequency capacitive coupling plasma 14 is a kind of glow-discharged plasma being uniform and steady, and this plasma 14 can be coated directly onto the surface of the glass substrate 31 from within the gap 13 such that the plasma 14 can have a sufficient uniform contact with the surface of the glass substrate 31. Therefore, the APP processing apparatus according to the embodiment of present invention can cause an even distribution of the plasma 14 on the glass substrate 31, thereby effectively avoiding the slough of photoresist after being coated on the glass substrate 31 and thus improving the yield rate of product.

The APP processing apparatus according to the embodiment of present invention eliminates the need for insulation dielectric between the two electrode plates, thus reducing the manufacturing cost of the APP processing apparatus, and further facilitating subsequent work of maintenance and parts replacement.

Additionally, as the APP processing apparatus provided according to the embodiment of present invention generates radio frequency capacitive coupling plasma in a glow-discharge manner, the required breakdown voltage is low and the discharging is easy, thus allowing larger ratio of active gases to be incorporated into the reacting gas (inert gas), so that the processing capacity of the APP processing apparatus upon the surface of the glass substrate 31 as well as its adjustability can be improved.

Embodiment 2

Figure 3:
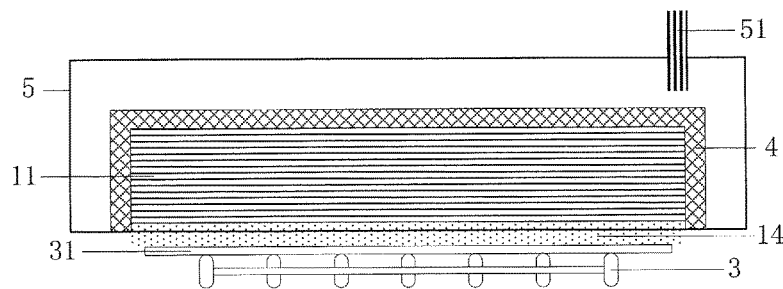
FIG. 3 is a structural schematic view of the APP processing apparatus according to embodiment 2 of present invention when viewed from another side.

This embodiment is essentially identical to embodiment 1. As shown in FIG. 3, in this embodiment, the inner surface of the front electrode plate 11 is a flat surface and is connected to the negative pole of the radio-frequency generator 21 and is grounded; while the inner surface of the rear electrode plate 12 is a stepped surface and is connected to the positive pole of the radio-frequency generator 21.

Furthermore, in this embodiment, further to embodiment 1, a matcher 22 is provided, being connected in series between the negative pole of the radio-frequency generator 21 and the front electrode plate 11. The Matcher 22 can regulate its own impedance (capacitive impedance and inductive impedance) based on the impedance changes of the plasma 14, so as to achieve impedance matching between the radio-frequency generator 21 and load (the two electrode plates 11, 12 and the plasma 14), thereby preventing the power reflection induced by mismatching from returning to the radio-frequency generator 21, and causing failure of the radio-frequency generator 21. With the adding of the matcher 22, more energy can be coupled to the plasma 14, thereby further improving the steadiness of the plasma 14 and its efficiency of surface treatment upon the glass substrate 31.

As shown in FIG. 3, in this embodiment, the length of the two electrode plates 11, 12 in the direction perpendicular to the conveying direction of the conveyor mechanism 3 and parallel to the surface of the substrate is slightly greater than the width of the glass substrate 31 being processed in the same direction. When the glass substrate 31 is conveyed by the conveyor mechanism 3 along the direction inwardly perpendicular to the paper surface of FIG. 3, the entire surface of the glass substrate 31 can contact with the plasma 14 such that every part of the glass substrate 31 can be "coated" with plasma 14.

Figure 4:
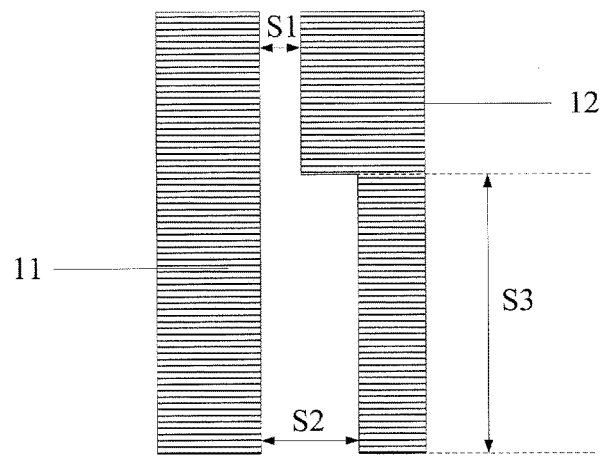
FIG. 4 is a schematic view of the size of gap in the APP processing apparatus according to embodiment 2 of present invention.

As shown in FIG. 4, the width S1 of the narrower gap portion of the gap in the thickness direction perpendicular to the opposing surfaces of the two electrode plates is less than 1 mm; and the width S2 of the wider gap portion in the thickness direction can be in the range of 2-4 mm, preferably about 3 mm, thus a optimal discharge effect can be achieved. The height S3 of the wider gap portion in the vertical direction should not be too long, since overlength of S3 will increase the difficulty for plasma to flood out of the lower end of the wider gap portion, while shortness of S3 will cause the volume of the plasma too small to generate a large area of steady plasma. Therefore S3 here is preferably about 10 cm, which can also facilitate maintaining the spacing between the two electrode plates and the glass substrate in a safe distance range.

Figure 2:
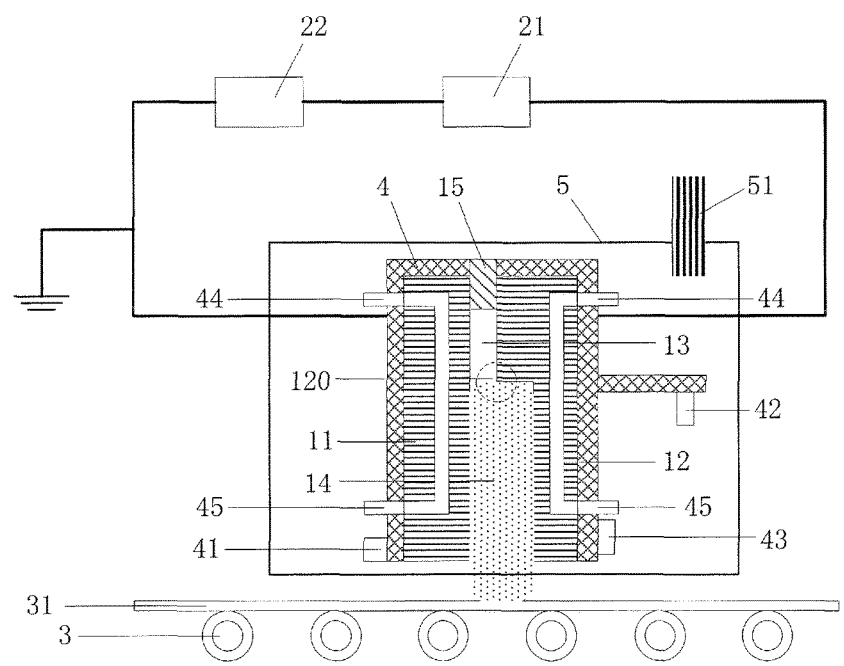
FIG. 2 is a structural schematic view of an APP processing apparatus according to embodiment 2 of present invention.

As shown in FIG. 2, in this embodiment, a gas distributor 15 is provided at the top of the narrower gap portion of the gap 13, and this gas distributor 15 is connected to the reactant gas supply located outside of the housing of the APP processing apparatus and is used for supplying the reactant gas for the discharge into the gap 13 and making reactant gas evenly distributed in the gap. On the other hand, exhaust gas generated during the processing can be discharged through an exhaust passage on the housing 5 of the APP processing apparatus.

When the radio-frequency generator 21 applies radio frequency (electric field) signals between the two electrode plates 11, 12, the lobing 120 at the corner on the stepped surface of the front electrode plate 11 will, due to its intensive electric field and its opposing rear electrode plate 12 having a flat inner surface, cause corona or glow-discharge, thereby achieving the effect of glow-discharge and subsequently yielding a large area of steady glow-discharge in the reactant gas flowing between the two electrode plates 11, 12 with the increasing of the power of the radio-frequency generator 21. Because of the narrower gap and the wider gap portions of the gap 13 between the two electrode plates 11, 12, the flow of reactant gas within the gap 13 can cause a certain differential gas pressure between these two portions, in such a way that discharging only occurs at the wider gap portion having a higher atmospheric pressure between the two electrode plates 11, 12, that is, radio frequency capacitive coupling plasma 14 is generated within the wider gap portion of the gap 13 between the two electrode plates 11, 12. At the same time, the matcher 22 can maintain the impedance matching between the radio-frequency generator 21 and load, such that the APP processing apparatus can create radio frequency capacitive coupling plasma 14 efficiently and steadily. At this point, when the glass substrate 31 passes below the two electrode plates 11, 12 under the driving of the conveyor mechanism 3, the radio frequency capacitive coupling plasma 14 within the gap 13 can perform surface treatment to the glass substrate 31.

In the embodiment of present invention, the radio frequency capacitive coupling plasma 14 is a kind of glow-discharged plasma being uniform and steady, and this plasma 14 can be coated directly onto the surface of the glass substrate 31 from within the gap 13 such that the plasma 14 can have a sufficient uniform contact with the surface of the glass substrate 31. Therefore, the APP processing apparatus according to the embodiment of present invention can cause an even distribution of the plasma 14 on the glass substrate 31, thereby effectively avoiding the slough of photoresist after being coated on the glass substrate 31 and thus improving the yield rate of product.

Figure 5:
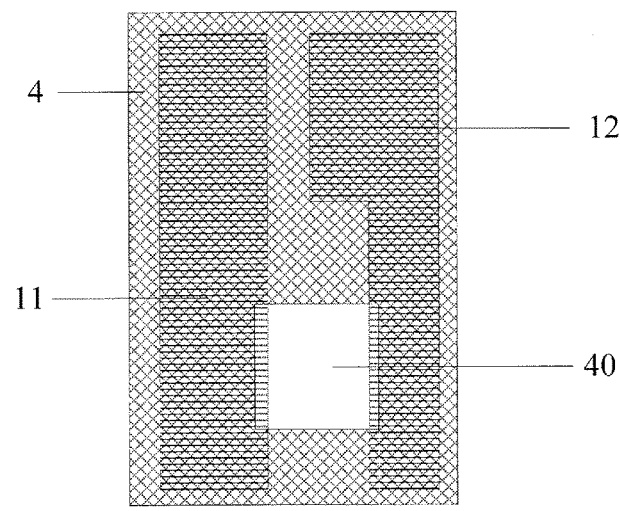
FIG. 5 is a schematic view of the insulating material in the APP processing apparatus according to embodiment 2 of present invention.

Preferably, the outer surface of the two electrode plates 11, 12 and the openings at the top and at both sides of the gap 13 can be covered with insulating material 4, and the insulating material 4 forms a shell-shaped insulating layer which opens downward and encases the two electrode plates 11, 12 and the gap 13. The insulating material 4 should preferably be high temperature resistant and corrosion resistant macromolecule insulating material, so as to ensure the steadiness of the electric field between the two electrode plates 11, 12. Furthermore, as shown in FIG. 5, the insulating material 4 covering on the openings at the sides of the gap 13 can be provided with a window for exposing part of the wider gap portion of the gap 13. It's thus allowed to insert silica glass piece through the window 40, so that the emission spectrometer or other optical instruments can sample real-time parameters of the plasma.

In this embodiment, a distance sensor 41 is further provided at the bottom of the front electrode plate 11 for detecting the distance between the two electrode plates 11, 12 and the glass substrate 31. The distance sensor 41 is for example a contact sensor 41, and the initial position thereof is at the same level as the lower edge of the two electrode plates 11, 12. When the glass substrate 31 is transmitted to a point below the two electrode plates 11, 12, the probe (not shown in the drawings) of the contact sensor 41 moves downward slowly. The probe goes back as soon as it touches the surface of the glass substrate 31 and at the same time feeds the obtained distance value back to a control system. The control system may perform fine adjustment of the position of the two electrode plates 11, 12, so that the distance between the two electrode plates 11, 12 and the glass substrate 31 is kept in a favorable extent. The distance is preferably kept at 5 mm or so.

Further, the APP processing apparatus can be further provided with a static-electricity detector 42 and a temperature detector 43. Wherein the static-electricity detector 42 is used for detecting the surface static-electricity of the glass substrate 31 after being processed by the APP processing apparatus, and the temperature detector 43 is used for detecting the surface temperature of the glass substrate 31 after being processed by the APP processing apparatus. In this way, it's possible to real-time monitor whether the surface static-electricity and temperature of the glass substrate 31 exceed preset thresholds, so as to ensure the quality and stability of the surface treatment to the glass substrate 31.

Further, as shown in FIG. 2, the two electrode plates 11, 12 are both provided with a cooling water inlet 44 and a cooling water outlet 45. During operation of the APP processing apparatus, the cooling water can be supplied into the hollow interior of the two electrode plates 11, 12 from the cooling water inlet 44 to cool the two electrode plates 11, 12, and then discharged through the cooling water outlet 45, so that the two electrode plates 11, 12 are kept in a low temperature and the working temperature of the APP processing apparatus is guaranteed.

It should be understood by those skilled in the art that various modifications, combinations, sub-combinations and alterations may occur depending on design requirements and other factors insofar as they are within the scope of the appended claims or the equivalents thereof.

What is claimed is:

1. An Atmospheric-Pressure Plasma processing apparatus, for Atmospheric-Pressure Plasma processing of substrates, comprising a radio-frequency generator and two electrode plates disposed vertically and opposing each other,
    wherein the two electrode plates have two surfaces opposing to each other, one of which is an entirely flat surface, and the other is a stepped surface, such that a gap is provided between the two electrode plates and said gap consisting of one narrower gap part at an upper side and one wider gap part at a lower side, wherein the narrower gap part has a first constant gap width and the wider gap part has a second constant gap width; and
    the radio-frequency generator is connected to the two electrode plates, and applies radio-frequency signals to the two electrode plates so as to generate plasma within the gap.

2. The Atmospheric-Pressure Plasma processing apparatus according to claim 1, further comprising a conveyor mechanism located below the two electrode plates and conveying the substrate in a conveying direction perpendicular to the opposing surfaces of the two electrode plates.

3. The Atmospheric-Pressure Plasma processing apparatus according to claim 1, wherein a matcher is connected in series between the radio-frequency generator and one of the two electrode plates for impedance matching between the radio-frequency generator and the two electrode plates.

4. The Atmospheric-Pressure Plasma processing apparatus according to claim 1, wherein a width of the wider gap portion of the gap in a direction perpendicular to the opposing surfaces of the two electrode plates is about 2-4 mm.

5. The Atmospheric-Pressure Plasma processing apparatus according to claim 4, wherein the width of the wider gap portion of the gap is about 3 mm.

6. The Atmospheric-Pressure Plasma processing apparatus according to claim 1, wherein a height of the wider gap portion of the gap in a vertical direction is about 8-12 cm.

7. The Atmospheric-Pressure Plasma processing apparatus according to claim 6, wherein the height of the wider gap portion of the gap is about 10 cm.

8. The Atmospheric-Pressure Plasma processing apparatus according to claim 1, wherein a width of the narrower gap portion of the gap in the direction perpendicular to the opposing surfaces of the two electrode plates is less than 1 mm.

9. The Atmospheric-Pressure Plasma processing apparatus according to claim 1, wherein outer surfaces of the two electrode plates and openings at the upper end and at both sides of the gap are covered with insulating material, the insulating material forming a shell-shaped insulating layer opening downward so as to encase the two electrode plates and the gap.

10. The Atmospheric-Pressure Plasma processing apparatus according to claim 9, wherein the insulating material covered on the openings at the sides of the gap is formed with a window for exposing part of the wider gap portion of the gap.

11. The Atmospheric-Pressure Plasma processing apparatus according to claim 1, wherein a gas distributor is provided at a top of the gap, for supplying reactant gas into the gap and distributing evenly the reactant gas within the gap.

12. The Atmospheric-Pressure Plasma processing apparatus according to claim 1, wherein a distance sensor is provided at a bottom of one of the electrode plates for detecting a distance between the two electrode plates and the substrate.

13. The Atmospheric-Pressure Plasma processing apparatus according to claim 1, wherein the distance sensor is a contact sensor.

14. The Atmospheric-Pressure Plasma processing apparatus according to claim 1, further comprising a static-electricity detector for detecting surface static-electricity of the substrate processed by the Atmospheric-Pressure Plasma processing apparatus.

15. The Atmospheric-Pressure Plasma processing apparatus according to claim 1, further comprising a temperature detector for detecting surface temperature of the substrate processed by the Atmospheric-Pressure Plasma processing apparatus.

16. The Atmospheric-Pressure Plasma processing apparatus according to claim 1, wherein a stepped surface has only one step.

17. The Atmospheric-Pressure Plasma processing apparatus according to claim 1, wherein a protrusion at a corner on the stepped surface is opposed to the flat surface in a direction perpendicular to the flat surface.

* * * * *